US010593544B2

(12) United States Patent
Zhao et al.

(10) Patent No.: US 10,593,544 B2
(45) Date of Patent: Mar. 17, 2020

(54) METHOD FOR FORMING A THIN FILM COMPRISING AN ULTRAWIDE BANDGAP OXIDE SEMICONDUCTOR

(71) Applicant: Case Western Reserve University, Cleveland, OH (US)

(72) Inventors: Hongping Zhao, Beachwood, OH (US); Subrina Rafique, Cleveland, OH (US); Lu Han, Cleveland Heights, OH (US)

(73) Assignee: Case Westen Reverse University, Cleveland, OH (US)

( * ) Notice: Subject to any disclaimer, the term of this patent is extended or adjusted under 35 U.S.C. 154(b) by 47 days.

(21) Appl. No.: 15/784,891

(22) Filed: Oct. 16, 2017

(65) Prior Publication Data

US 2018/0108525 A1      Apr. 19, 2018

Related U.S. Application Data

(60) Provisional application No. 62/408,219, filed on Oct. 14, 2016, provisional application No. 62/458,885, filed on Feb. 14, 2017.

(51) Int. Cl.
  *H01L 31/10*       (2006.01)
  *H01L 21/02*       (2006.01)
  (Continued)

(52) U.S. Cl.
  CPC ........ *H01L 21/02565* (2013.01); *C30B 25/02* (2013.01); *C30B 25/16* (2013.01); *C30B 29/16* (2013.01); *H01L 21/0242* (2013.01); *H01L 21/0257* (2013.01); *H01L 21/0262* (2013.01); *H01L 21/02414* (2013.01); *H01L 21/02433* (2013.01); *H01L 21/443* (2013.01);
  (Continued)

(58) Field of Classification Search
  CPC .................................................. H01L 21/0257
  See application file for complete search history.

(56) References Cited

U.S. PATENT DOCUMENTS

4,859,253 A * 8/1989 Buchanan ............. H01L 21/318
                                                    148/33.3
4,923,717 A * 5/1990 Gladfelter ........... C23C 16/0281
                                                    427/252
(Continued)

FOREIGN PATENT DOCUMENTS

EP           3054037 A1     8/2016

*Primary Examiner* — Moazzam Hossain
*Assistant Examiner* — Omar F Mojaddedi
(74) *Attorney, Agent, or Firm* — Kaplan Breyer Schwarz, LLP

(57) ABSTRACT

A method is disclosed for depositing a high-quality thin films of ultrawide bandgap oxide semiconductors at growth rates that are higher than possible using prior-art methods. Embodiments of the present invention employ LPCVD deposition using vapor formed by evaporating material as a precursor, where the material has a low vapor pressure at the growth temperature for the thin film. The vapor is carried to a reaction chamber by an inert gas, such as argon, where it mixes with a second precursor. The reaction chamber is held at a pressure that nucleation of the precursor materials occurs preferentially on the substrate surface rather than in vapor phase. The low vapor pressure of the material gives rise to growth rates on the substrate surface that a significantly faster than achievable using prior-art growth methods.

20 Claims, 7 Drawing Sheets

(51) Int. Cl.
*H01L 31/032* (2006.01)
*H01L 21/443* (2006.01)
*C30B 29/16* (2006.01)
*C30B 25/16* (2006.01)
*H01L 29/24* (2006.01)
*H01L 29/872* (2006.01)
*H01L 29/66* (2006.01)
*C30B 25/02* (2006.01)
*H01L 31/047* (2014.01)
H01L 31/18 (2006.01)
H01L 31/103 (2006.01)

(52) U.S. Cl.
CPC ........ *H01L 29/24* (2013.01); *H01L 29/66969* (2013.01); *H01L 29/872* (2013.01); *H01L 31/047* (2014.12); H01L 21/02378 (2013.01); H01L 21/02389 (2013.01); H01L 31/032 (2013.01); H01L 31/103 (2013.01); H01L 31/18 (2013.01)

(56) References Cited

U.S. PATENT DOCUMENTS

| | | |
|---|---|---|
| 7,977,673 B2 | 7/2011 | Ichinose et al. |
| 2006/0150891 A1* | 7/2006 | Ichinose ........... H01L 21/02414 117/2 |
| 2012/0192794 A1* | 8/2012 | Kinoshita ............... C30B 25/14 118/725 |

* cited by examiner

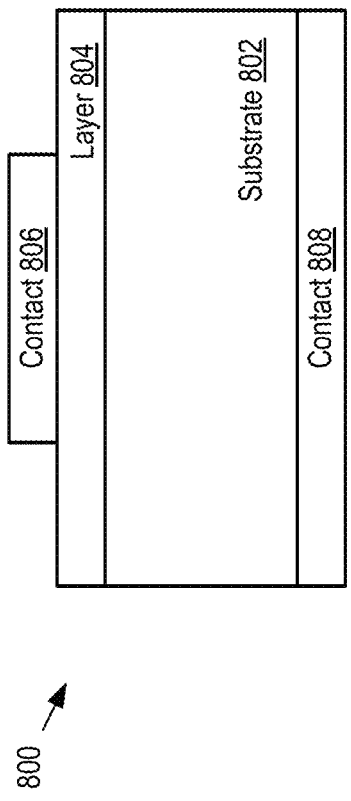
FIG. 8
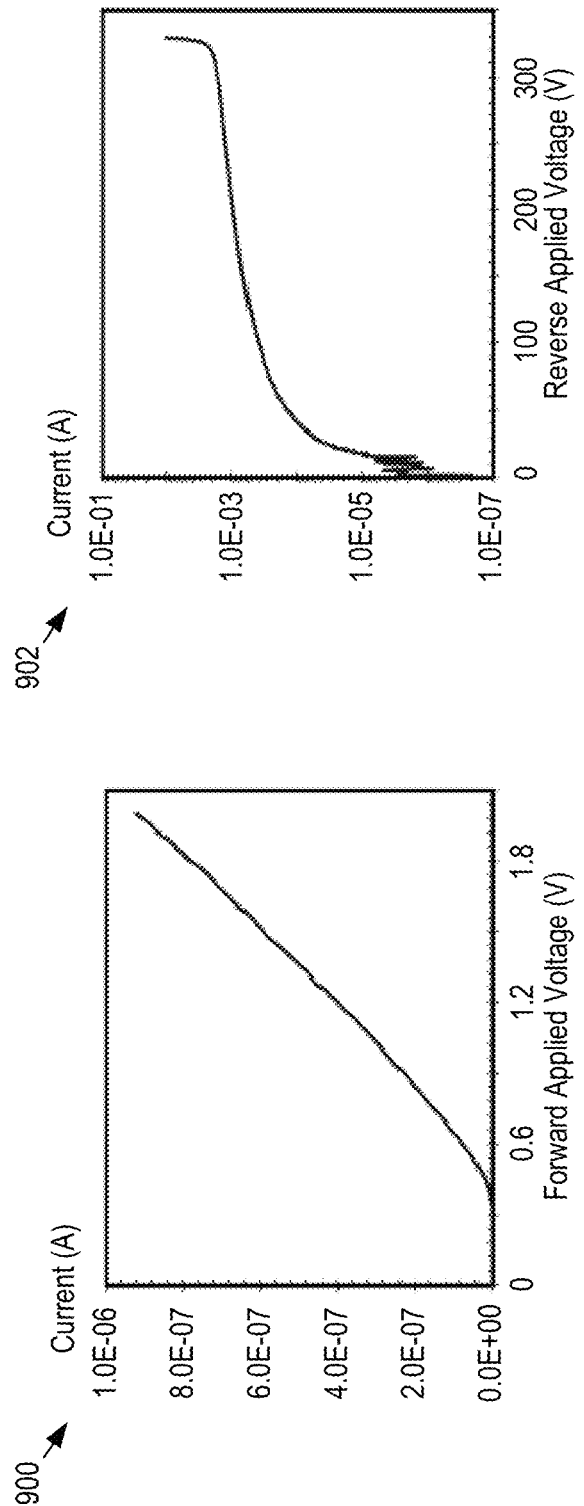
FIG. 9B
FIG. 9A

METHOD FOR FORMING A THIN FILM COMPRISING AN ULTRAWIDE BANDGAP OXIDE SEMICONDUCTOR

CROSS REFERENCE TO RELATED APPLICATIONS

This case claims priority of U.S. Provisional Patent Application Ser. No. 62/408,219, filed Oct. 14, 2016 and U.S. Provisional Patent Application Ser. No. 62/458,885, filed Feb. 14, 2017, each of which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to ultrawide bandgap oxide semiconductor devices in general, and, more particularly, to the formation of thin films of ultrawide bandgap oxide semiconductors.

BACKGROUND OF THE INVENTION

Silicon is the principle material used in the making of diodes and transistors for the power electronics market. Unfortunately, while silicon is low cost, it is not very efficient. A larger energy bandgap enables a material to withstand a strong electric field, making it possible to use a thinner device for a given voltage. A thinner device is highly desirable because it can have a lower on-resistance and higher efficiency. Although the weakness of silicon power electronics is addressed by forming devices in wide bandgap silicon carbide (SiC) and gallium nitride (GaN), such devices have had limited commercial success to date because they are much more expensive to fabricate and have also exhibited significant reliability issues.

Ultrawide bandgap semiconductors (UWBGS) are rapidly emerging as important alternatives to silicon, however, because they enable electrical devices that operate at significantly higher voltages, frequencies and temperatures. UWBGS have become leading contenders for use in next-generation devices for general semiconductor use.

Gallium oxide ($Ga_2O_3$) is an example of an ultrawide bandgap oxide semiconductor having excellent chemical and thermal stability up to 1400° C. Gallium oxide ($Ga_2O_3$) has a band gap of 4.5-4.9 eV, which is much higher than that of the GaN (3.4 eV) and 4H-SiC (3.2 eV). It also exhibits high transparency in both the deep ultraviolet (DUV) and visible wavelength regions due to its very large bandgap. Furthermore, it has a transmittance of over 80% in the ultraviolet (UV) region. The monoclinic β-phase $Ga_2O_3$ represents the thermodynamically stable crystal among the known five phases ($\alpha$, $\beta$, $\gamma$, $\delta$, $\varepsilon$). The breakdown field of β-$Ga_2O_3$ is estimated to be 8 MV/cm, which is about three times larger than that of 4H-SiC and GaN. As a result, β-$Ga_2O_3$ is a promising material candidate for use in high-power electronics, as well as solar-blind photodetectors. In addition, single-crystal β-$Ga_2O_3$ substrates can be synthesized using scalable and low-cost melting-based growth techniques, such as edge-defined film-fed growth (EFG), floating zone (FZ) and Czochralski methods.

While formation of single-crystal β-$Ga_2O_3$ substrates is relatively straight-forward, the ability to grow high-quality and controllably doped β-$Ga_2O_3$ thin films has not been realized. Device-quality epitaxial thin films must have a high degree of purity, crystallinity, and be able to be doped controllably. Furthermore, these qualities much be achievable in films that can be grown at reasonable growth rates.

Prior-art growth techniques for β-$Ga_2O_3$ thin films been primarily focused on homo-epitaxy on commercially available $Ga_2O_3$ substrates using either molecular beam epitaxy (MBE) or metalorganic vapor phase epitaxy (MOVPE). Unfortunately, while conventional approaches have been successful in forming high-quality β-$Ga_2O_3$ thin films, reported growth rates have been too slow (~2-10 nm/min.) for use in a practical device-manufacturing application.

In an effort to increase growth rate, growth of β-$Ga_2O_3$ films at atmospheric pressure using halide vapor-phase epitaxy (HVPE) using gallium chloride (GaCl) and oxygen ($O_2$) as precursors was explored. Unfortunately, while higher growth rates were demonstrated (>5 μm/hour), the toxicity of the hydrochloric acid and chlorine sources used in the HVPE growth process is undesirable. In addition, these sources can introduce deleterious defect levels and impurity centers in the resultant thin films.

The need for a method of forming high-quality gallium oxide films at high growth rates remains unmet in the prior art.

SUMMARY OF THE INVENTION

The present invention enables synthesis of a layer of ultrawide bandgap oxide semiconductor, such as gallium oxide, lithium gallium oxide, indium oxide, aluminum gallium oxide, indium gallium oxide, and the like, on a variety of substrates with high growth rates with good doping control and low concentrations of impurities and defects. Embodiments of the present invention employ low-pressure chemical vapor deposition (LPCVD) with high-purity precursors that include a low-vapor-pressure precursor vapor, where the deposition is performed at chamber pressures that are much lower than the atmospheric pressure. Embodiments of the present invention are particularly well suited for fabrication of thin-film devices such as deep-ultraviolet optical emitters, solar-blind photodetectors, high-temperature gas sensors, transparent electronic devices, and high-power devices.

An illustrative embodiment is a method for forming an unintentionally doped β-$Ga_2O_3$ thin film on a c-sapphire substrate by LPCVD deposition using gallium vapor as a precursor. The gallium vapor is generated by evaporating pure gallium in a low-pressure (<50 Torr) environment. Once generated, the gallium vapor is brought to a substrate by a carrier gas of argon. In the depicted example the substrate is a c-sapphire substrate. The growth temperature is controlled at approximately 900° C. to achieve a growth rate of approximately 6 μm/hour.

In some embodiments, the pressure of the LPCVD reaction chamber is held at or below 50 Torr to give rise to conditions that favor heterogeneous nucleation on the substrate over homogeneous nucleation in gas phase.

In some embodiments, growth conditions are controlled to grow Si-doped β-$Ga_2O_3$ having dopant concentrations within the range of approximately $5 \times 10^{15}$ $cm^{-3}$ to $5 \times 10^{20}$ $cm^{-3}$.

In some embodiments, growth conditions are controlled to grow semi-insulating β-$Ga_2O_3$ films.

In some embodiments, formation an ultrawide bandgap oxide semiconductor thin film is performed on a substrate other than c-sapphire, such as native (010) or (−201) or (001) or (100) Ga$_2$O$_3$ substrates, gallium nitride (GaN), magnesium oxide (MgO), nickel oxide (NiO), silicon carbide (SiC), and the like.

In some embodiments, the deposition method enables film growth on substrates having different crystal orientations.

In some embodiments, the deposition method enables epitaxial growth of a different ultrawide bandgap oxide semiconductor, such as indium oxide, indium gallium oxide, aluminum gallium oxide, lithium gallium oxide, etc.

In some embodiments, the deposition method enables film growth on substrates having a lattice constant within approximately 10% of the lattice constant of β-Ga$_2$O$_3$ (i.e., within the range of approximately −10% to approximately +10%).

An embodiment of the present invention is a method comprising: forming a first layer on a substrate, wherein the first layer includes a first material that is substantially crystalline and is an ultrawide bandgap oxide semiconductor, and wherein the first layer is formed by operations comprising: evaporating a second material to form a first vapor; providing the first vapor to a reaction chamber; providing a first precursor comprising a third material to the reaction chamber; reacting the first vapor and the first precursor to nucleate the first material; controlling the temperature of the substrate at a first temperature; and controlling the pressure in the reaction chamber to mitigate homogeneous nucleation of the first material.

Another embodiment of the present invention is a method comprising: (1) providing a substrate; (2) growing a first layer on the substrate via epitaxial growth, the first layer comprising a first material that an ultrawide bandgap oxide semiconductor, wherein the first layer is grown by operations that include; (i) evaporating a second material to form a first vapor, wherein the second material is characterized by a vapor pressure that is less than or equal to 1 Torr at a first temperature; (ii) combining the first vapor with a first carrier gas to form a first mixture, wherein the first carrier gas is an inert gas; (iii) providing the first mixture to a reaction chamber; (iv) providing a first precursor comprising a third material to the reaction chamber; (v) reacting the first vapor and the first precursor to nucleate the first material; (vi) heating the substrate to the first temperature; and (vii) controlling the pressure in the reaction chamber such that it is less than or equal to 50 Torr.

BRIEF DESCRIPTION OF THE DRAWINGS

FIG. 8 depicts a schematic drawing of a cross-sectional view of a high-power electronics device in accordance with the present invention.

FIGS. 9A-B depict measured current-voltage (I-V) curves for device 800 in the forward-biased and reverse-biased directions, respectively.

DETAILED DESCRIPTION

Figure 1:
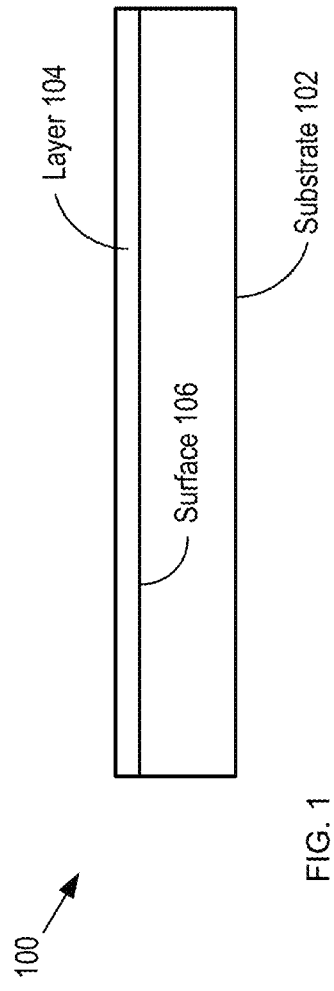
FIG. 1 depicts a schematic drawing of a cross-sectional view of an ultrawide bandgap oxide semiconductor structure in accordance with an illustrative embodiment of the present invention.

FIG. 1 depicts a schematic drawing of a cross-sectional view of an ultrawide bandgap oxide semiconductor structure in accordance with an illustrative embodiment of the present invention. Structure 100 comprise substrate 102 and layer 104. For the purposes of this Specification, including the appended claims, the term "ultrawide bandgap oxide semiconductor" is defined as an oxide semiconductor having a bandgap greater than 3.4 eV (i.e., the bandgap of GaN).

Figure 2:
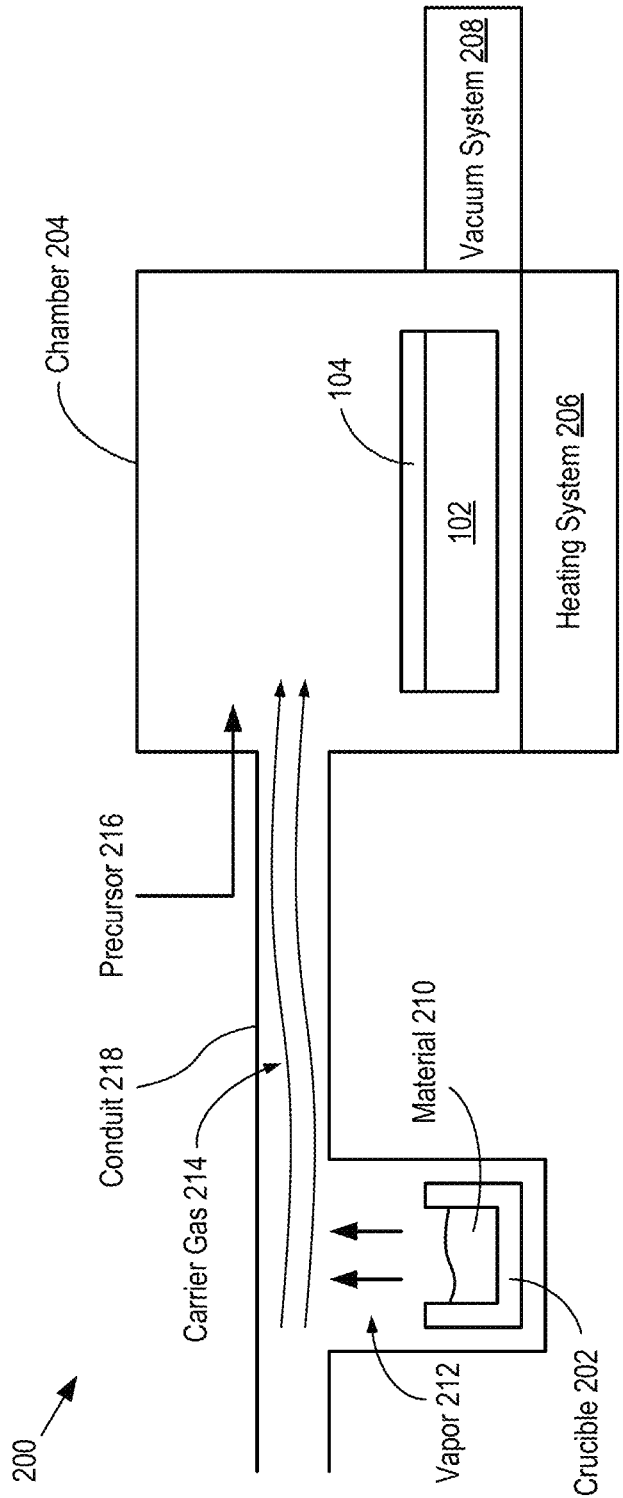
FIG. 2 depicts a growth system suitable for forming an ultrawide bandgap oxide semiconductor structure in accordance with the present invention.

FIG. 2 depicts a growth system suitable for forming an ultrawide bandgap oxide semiconductor structure in accordance with the present invention. Growth system 200 includes crucible 202, reaction chamber 204, heating system 204, and vacuum system 208.

Figure 3:
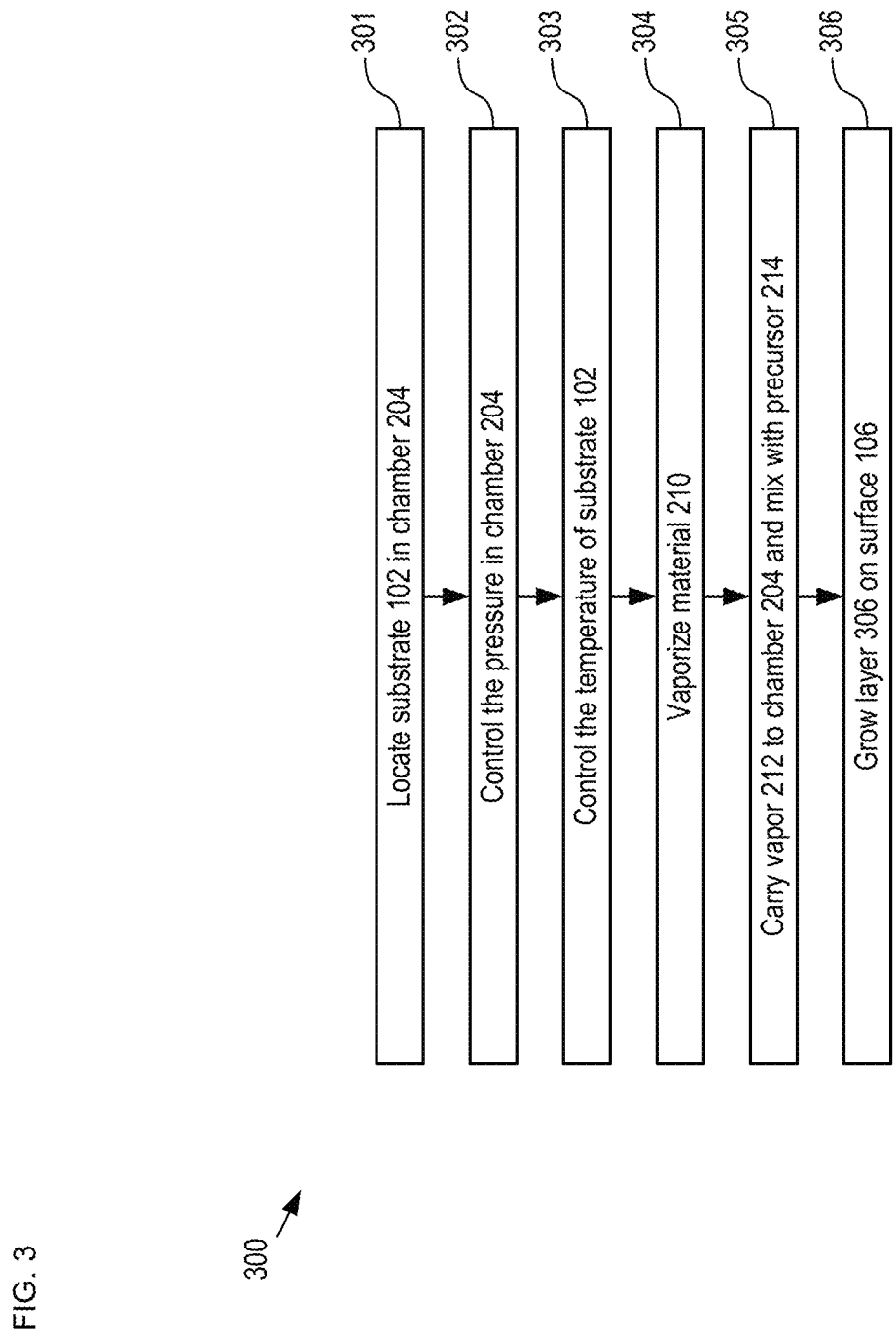
FIG. 3 depicts a method for forming an ultrawide bandgap oxide semiconductor structure in accordance with the illustrative embodiment.

FIG. 3 depicts a method for forming an ultrawide bandgap oxide semiconductor structure in accordance with the illustrative embodiment. Method 300 begins with operation 301, wherein substrate 102 is placed in reaction chamber 204. Method 300 is described herein with continuing reference to FIGS. 1 and 2.

Substrate 102 is a conventional c-sapphire substrate. In some embodiments, substrate 102 is a different substrate having a lattice constant that is within 10% of the lattice constant of β-Ga$_2$O$_3$. Substrate materials suitable for use in embodiments of the present invention include, without limitation, native (010) Ga$_2$O$_3$, native (−201) Ga$_2$O$_3$, native (001) Ga$_2$O$_3$, native (100) Ga$_2$O$_3$, gallium nitride (GaN), magnesium oxide (MgO), nickel oxide (NiO), silicon carbide (SiC) and the like.

Chamber 204 is a conventional LPCVD reaction chamber that is operatively coupled to one or more conventional support systems, including heating system 206 and vacuum system 208.

At operation 302, vacuum system 208 controls the pressure in chamber 204 at a pressure that fosters nucleation of gallium oxide on substrate surface 106 (i.e., heterogeneous nucleation) rather than reaction in the gas phase (i.e., homogeneous nucleation). In the depicted example, chamber 204 is evacuated to approximately 4 Torr; however, in some embodiments, the pressure in vacuum system 208 is controlled at a different pressure. Preferably, however, the pressure in chamber 204 is held to less than 50 Torr. In some embodiments, the pressure in chamber 204 is controlled to a different pressure within the range of approximately 1 Torr to approximately 50 Torr.

One skilled in the art will recognize that, during the chemical vapor deposition process, precursor vapors transported to the growth chamber can be consumed by homogeneous (nuclei are formed in vapor form before being deposited) or heterogeneous (nuclei are formed on the substrate) nucleation. In the prior art, gallium oxide CVD growth is performed at high pressure (i.e., greater than 50 Torr). Unfortunately, growth at pressures above 50 Torr promotes vapor-phase reactions that reduces the film growth rate on substrate. It is an aspect of the present invention that, by maintaining a low pressure in chamber 204 during growth, the likelihood of undesirable homogeneous nucleation in the gas phase is reduced. For the LPCVD growth of $Ga_2O_3$ using metallic gallium as precursor, a growth pressure of 50 Torr or less is preferred.

At operation 303, heating system 206 heats substrate 102 to approximately 900° C. One skilled in the art will recognize, after reading this Specification, that other growth temperatures can be used without departing from the scope of the present invention. Preferably, the growth temperature is controlled within the range from approximately 750° C. to approximately 1000° C.

At operation 304, material 210 is vaporized to provide vapor 212 in conduit 218. Material 210 is vaporized by heating crucible 202.

Preferably, material 210 is a material that is characterized by a vapor pressure at the growth temperature that is less than or equal to 10 Torr. In the depicted example, material 210 is high-purity gallium, typically in pellet form. For the purposes of this Specification, including the appended claims, the term "high purity" is defined as having a purity of at least 99.9999%. Embodiments of the present invention derive particular advantages over the prior art by employing a low-vapor-pressure precursor material in the LPCVD growth of layer 104. The vapor pressure of a material is dependent on is material properties and its temperature. Prior-art MOCVD growth processes typically employ precursors of Trimethylgallium (TMGa) and/or Triethylgallium (TEGa), which have vapor pressures of approximately 40 Torr at −10° C. and approximately 5.10 Torr at 20° C., respectively.

In contrast to the prior art, the vapor pressure of vaporized gallium is very low (approximately 3.55 mTorr at 900° C.). Due to this low vapor pressure, at the growth temperatures in accordance with the present invention (e.g., 780-950° C.), the probability of vapor-phase reaction between gallium and oxygen is relatively low.

In some embodiments, material 210 is a material other than pure gallium.

It should be noted that methods in accordance with the present invention are suitable for depositing materials other than ultra-wide bandgap semiconductors. Examples of other materials suitable for deposition in accordance with the present invention include, without limitation, ultrawide bandgap oxide semiconductors, such as lithium gallium oxide ($LiGaO_2$), etc. $LiGaO_2$ is an example of an ultrawide bandgap material with bandgap of about 5.6 eV. During deposition of $LiGaO_2$, therefore, material 210 would comprise high-purity lithium. In similar fashion to gallium, lithium has a relatively low vapor pressure (at 1000K, the vapor pressure of Li is approximately 0.76 Torr). Other sources of vapor 212 that can be used as precursor include lithium carbonate ($Li_2CO_3$). As a result, LPCVD growth methods in accordance with the present invention are applicable to grow $LiGaO_2$, and similar materials, on a variety of substrates (e.g., sapphire, GaN, $Ga_2O_3$, MgO, NiO, SiC and etc.).

At operation 305, carrier gas 214 is flowed through conduit 218 to carry vapor 212 to chamber 204 where it mixes with precursor 216. In the depicted example, carrier gas 214 is high-purity argon and precursor 216 is high-purity oxygen; however, other carrier and precursor gasses can be used without departing from the scope of the present invention.

The selection of the precursors is typically based on the consideration of the desired growth rate, reaction temperature, impurity levels and crystallinity of the resultant $\beta$-$Ga_2O_3$ films. Although the vapor pressure of evaporated gallium is relatively low (as discussed above) as compared to that of the trimethylgallium (TMGa) or GaCl precursors used in prior-art growth methods, the high efficiency of the reaction between gallium and oxygen leads to a high growth rate of $\beta$-$Ga_2O_3$.

At operation 306, layer 104 is grown on surface 106 of substrate 102. In the depicted example, layer 104 is a layer of unintentionally doped $\beta$-$Ga_2O_3$.

Embodiments of the present invention are afforded significant advantages over prior-art growth methods, including:

i. an ability to grow very high-purity materials with low background doping and impurity levels due to the availability of high-purity precursors and relatively low growth pressure; or ii. a more efficient reaction process, which enables a wider growth window and high growth rates of epitaxial $\beta$-$Ga_2O_3$; or iii. a mitigated need for the use of hazardous gases; or iv. lower cost; or v. scalability; or vi. compatibility with industrial standards and large-scale manufacturing; or vii. any combination of i, ii, iii, iv, v, and vi.

It should be noted that, although the illustrative embodiment yields a thin-film layer that is an unintentionally doped layer of $\beta$-$Ga_2O_3$, other layers can be grown without departing from the scope of the present invention. Alternative layers in accordance with the present invention include, without limitation, n-type doped $\beta$-$Ga_2O_3$ thin films, semi-insulating $\beta$-$Ga_2O_3$ thin films, and the like.

In some embodiments, a dopant gas is included in chamber 204 during the growth of layer 104 to dope the layer as it is grown. For example, in some embodiments, $SiCl_4$ is added to yield an n-doped layer.

Using the exemplary growth conditions described above, thin-film growth rates of 0.8-10 μm/hour are achieved. In some embodiments, a lower growth pressure (<1 Torr) used to achieve faster growth rates.

X-ray diffraction (XRD), transmission electron microscopy (TEM), temperature dependent Hall measurement and Raman spectroscopy analysis indicate that high-material-quality $\beta$-$Ga_2O_3$ thin films result from the inventive method. The growth orientation of the thin film is determined by the growth substrate, while the thin-film growth rate depends primarily on growth conditions and source flow rates. LPCVD growth of $\beta$-$Ga_2O_3$ thin films also show that the film growth rate has a dependence on the substrate material.

Figure 4:
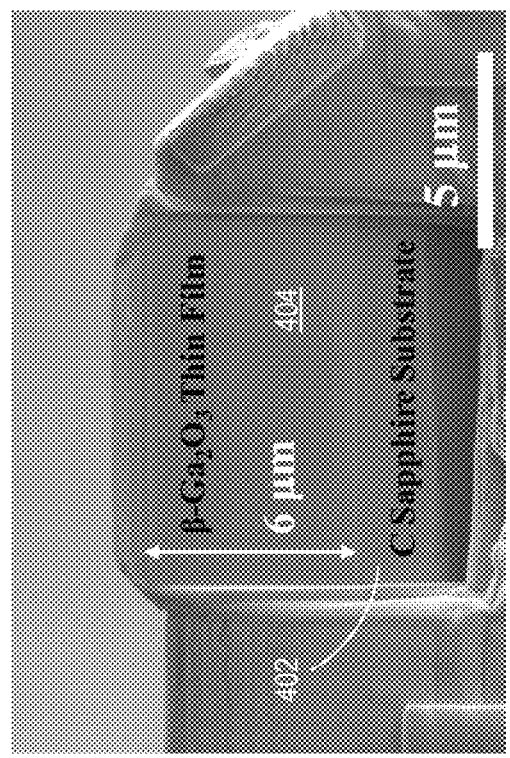
FIG. 4 shows a cross-sectional scanning-electron-microscope image of a β-Ga$_2$O$_3$ thin film grown on c-sapphire substrate in accordance with the present invention.

FIG. 4 shows a cross-sectional scanning-electron-microscope image of a $\beta$-$Ga_2O_3$ thin film grown on c-sapphire substrate in accordance with the present invention.

Substrate 402 is a conventional c-sapphire substrate and is analogous to substrate 102 described above.

Layer 404 is an unintentionally doped (UID) thin film that was grown for 1 hour at 900° C. Careful review of image 400 shows that the thickness of layer 404 is approximately 6 microns, which corresponds to a growth rate of 6 microns/hr.

Figure 5:
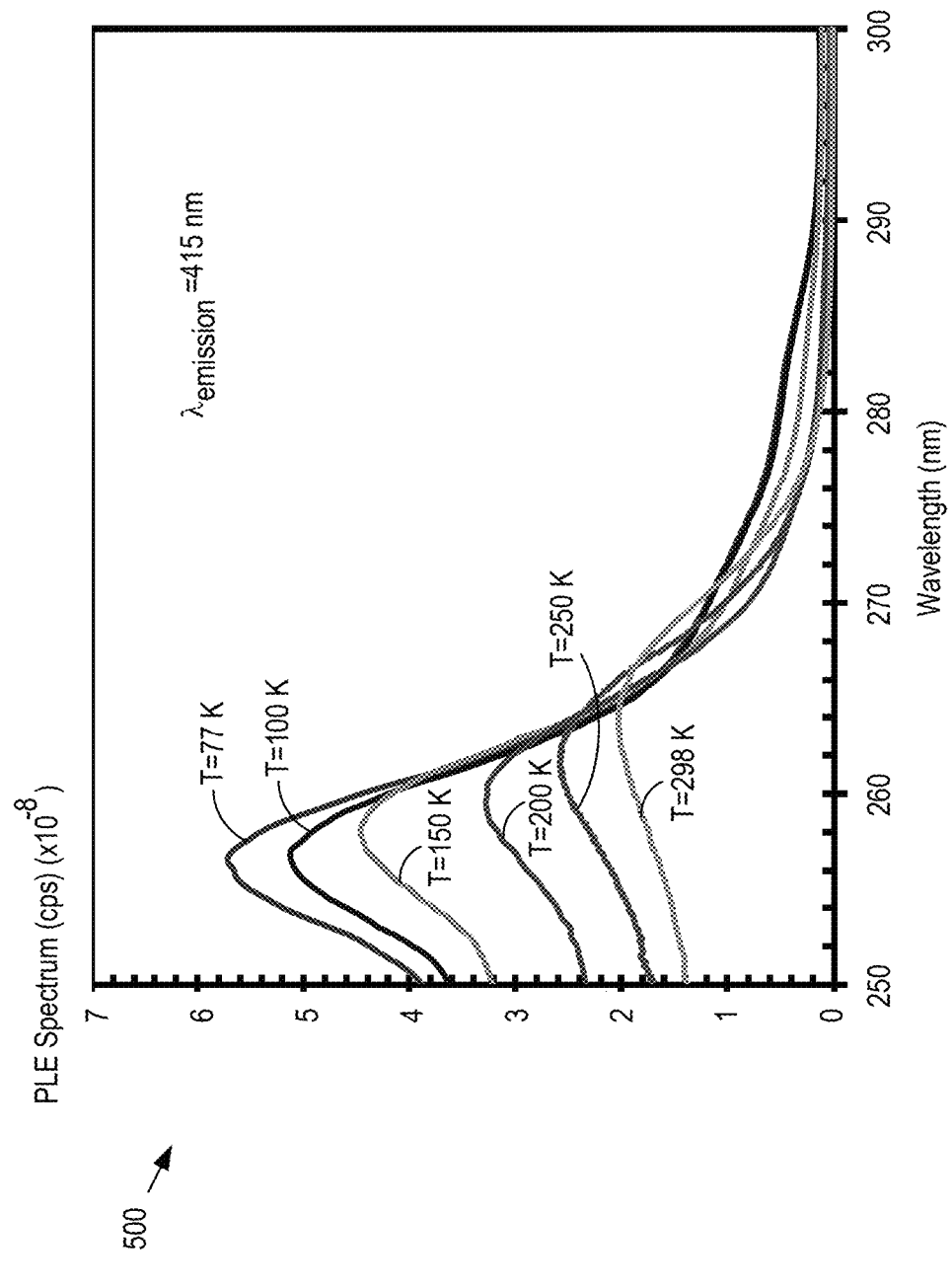
FIG. 5 shows a plot of photoluminescence excitation (PLE) spectra of a Si-doped β-Ga$_2$O$_3$ thin film in accordance with the present invention at a plurality of temperatures, where the grown layer has a doping concentration of 2.5× 10$^{18}$ cm$^{-3}$.

FIG. 5 shows a plot of photoluminescence excitation (PLE) spectra of a Si-doped $\beta$-$Ga_2O_3$ thin film in accordance with the present invention at a plurality of temperatures, where the grown layer has a doping concentration of 2.5× $10^{18}$ $cm^{-3}$. The PLE spectra were collected at an emission wavelength of $\lambda_{emission}$=415 nm. Careful review of plot 500 evinces that the PLE peaks redshift with increasing temperature: 257 nm (T=77K) to 266.4 nm (T=298K).

Figure 6:
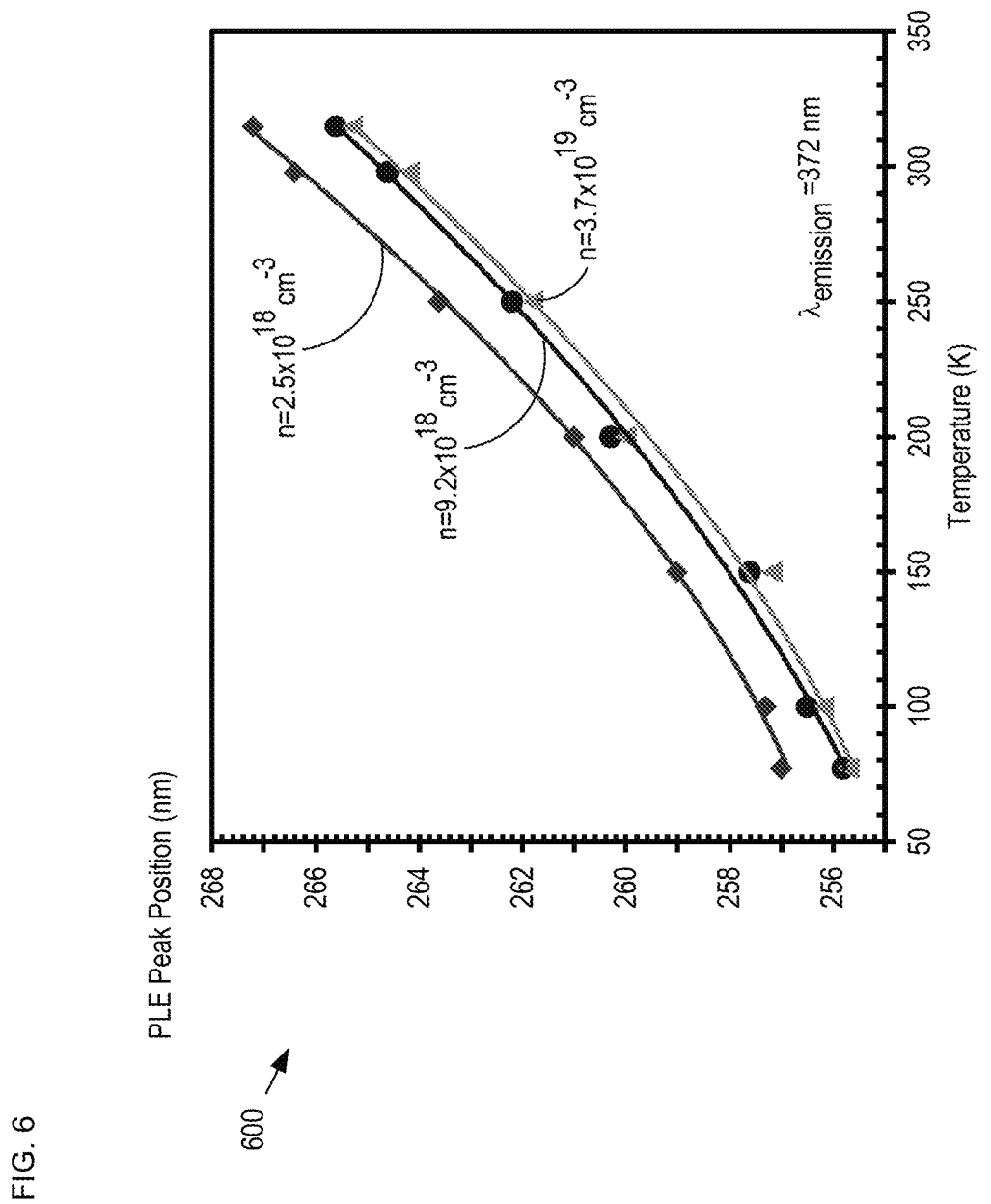
FIG. 6 shows plots of PLE peak positions as a function of temperature for layers in accordance with the present invention having different doping concentrations.

FIG. 6 shows plots of PLE peak positions as a function of temperature for layers in accordance with the present invention having different doping concentrations. Plot 600 shows the dependence of the PLE peak positions as a function of temperature for three different Si-doped β-Ga$_2$O$_3$ thin films having doping concentrations of 2.5×10$^{18}$, 9.2×10$^{18}$, 3.7×10$^{19}$ cm$^{-3}$, respectively. The corresponding PLE spectra were collected at an emission wavelength of $\lambda_{emission}$=372 nm.

For all three films, the PLE peaks showed a similar trend. The band gap shrinks as the increase of temperature. Such dependence of band gap on temperature has been reported for other semiconductor materials. The shrinkage of band gap with increasing temperature occurs mainly due to two contributing factors: (i) Thermal dilation of crystal lattice which reduces the overlap between the electron wave functions of neighboring atoms; and (ii) Electron-phonon interaction at finite temperature which changes the bond energy of the electron. At moderate temperature, lattice phonons are excited in large numbers. They influence the electron bonding energy through various orders of electron-phonon interactions. The change of bonding energy in turn alter the optical bandgap.

Optical reflectance spectroscopy was used to study the effects of doping concentration on the optical band gap of β-Ga$_2$O$_3$ thin films grown on c-sapphire substrates.

Figure 7:
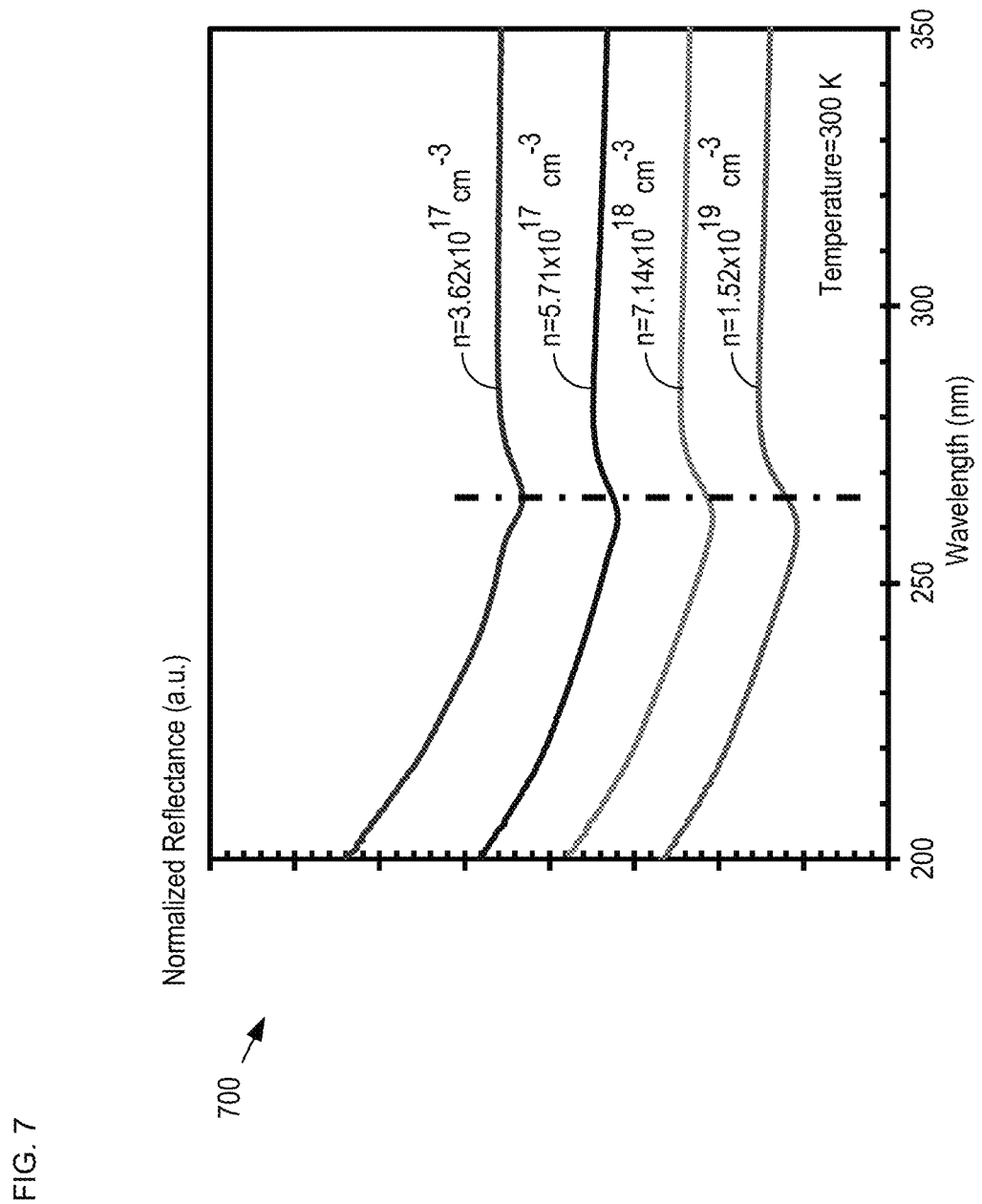
FIG. 7 shows a plot of the optical reflectance spectra of Si-doped β-Ga$_2$O$_3$ thin films with various carrier concentrations ranging from low-10$^{17}$ to low-10$^{19}$ cm$^{-3}$.

FIG. 7 shows a plot of the optical reflectance spectra of Si-doped β-Ga$_2$O$_3$ thin films with various carrier concentrations ranging from low-10$^{17}$ to low-10$^{19}$ cm$^{-3}$. Careful review of plot 700 shows that the reflectance peaks for the samples shift toward shorter wavelengths as doping concentration increases (i.e., they blue shift with increasing concentration). In addition, the band gap shifts from 265.5 nm (n=3.62×10$^{17}$ cm$^{-3}$) to 259.9 nm (n=1.52×10$^{19}$ cm$^{-3}$) as the doping level increases. This result is in agreement with the results shown in plot 600. It is believed that the increase in band gap with increasing carrier concentration is due to the Burstein-Moss (BM) shift for a doped semiconductor.

FIG. 8 depicts a schematic drawing of a cross-sectional view of a high-power electronics device in accordance with the present invention. Device 800 is a Schottky-barrier diode comprising substrate 802, layer 804, and contacts 806 and 808.

Substrate 802 is analogous to substrate 102 described above. In the depicted example, substrate 802 is a β-Ga$_2$O$_3$ (−201) substrate; however, other materials can be used in substrate 802 without departing from the scope of the present invention.

Layer 804 is analogous to layer 104 described above. In the depicted example, layer 804 is a β-Ga$_2$O$_3$ thin film having a thickness of approximately 0.92 microns. In some embodiments layer 804 has a different suitable thickness.

Contact 806 is a conventional multi-layer electrical contact suitable for electrically contacting layer 804. In the depicted example, contact 806 includes layers of platinum, titanium, and gold having thicknesses of approximately 15 nm, 5 nm, and 150 nm, respectively.

Contact 808 is a conventional multi-layer electrical contact suitable for electrically contacting substrate 802. In the depicted example, contact 808 includes layers of titanium and gold having thicknesses of approximately 80 nm and 140 nm, respectively.

FIGS. 9A-B depict measured current-voltage (I-V) curves for device 800 in the forward-biased and reverse-biased directions, respectively.

Careful review of plots 900 and 902 reveals that device 800 has a built-in potential of approximately 0.55 eV, an ideality factor of approximately 1.18, a Schottky barrier height of approximately 0.99 eV, and a breakdown voltage of approximately 320 V.

The present invention provides a new pathway to synthesize high-purity and high-crystalline quality homoepitaxial and heteroepitaxial β-Ga$_2$O$_3$ thin films with and without intentional doping. Advancements of low cost LPCVD of UWBG β-Ga$_2$O$_3$ with high material quality and reasonable growth rates will open up opportunities for low cost high power electronic devices and solar blind deep-UV photodetectors.

What is claimed is:

1. A method comprising: forming a first layer on a substrate, wherein the first layer includes a first material that is substantially crystalline and is an ultrawide bandgap oxide semiconductor, and wherein the first layer is formed by operations comprising:
    evaporating a second material to form a first vapor;
    providing the first vapor to a reaction chamber;
    providing a first precursor comprising a third material to the reaction chamber;
    reacting the first vapor and the first precursor to nucleate the first material;
    controlling a first temperature of the substrate within the range from approximately 750° C. to approximately 1000° C.; and
    controlling a pressure in the reaction chamber to mitigate homogeneous nucleation of the first material.

2. The method of claim 1 wherein the pressure is controlled such that it is less than or equal to approximately 50 Torr.

3. The method of claim 2 wherein the pressure is controlled such that it is within the range of approximately 1 Torr to approximately 50 Torr.

4. The method of claim 1 further comprising providing the second material such that it has a vapor pressure that is less than or equal to 10 Torr at the first temperature.

5. The method of claim 1 further comprising providing the substrate such that it comprises a fourth material that has a lattice constant that is within 10% of the lattice constant of the first material.

6. The method of claim 5 further comprising providing the substrate such that the fourth material is selected from the group consisting of sapphire, native (010) Ga$_2$O$_3$, native (−201) Ga$_2$O$_3$, native (001) Ga$_2$O$_3$, native (100) Ga$_2$O$_3$, gallium nitride (GaN), magnesium oxide (MgO), nickel oxide (NiO), and silicon carbide (SiC).

7. The method of claim 1 wherein the first layer is formed such that the first material is gallium oxide.

8. The method of claim 7 further comprising providing the second material as high-purity gallium.

9. The method of claim 8 further comprising providing the first precursor such that the third material is high-purity oxygen.

10. The method of claim 1 further comprising:
    forming a first electrical contact that is electrically coupled with the first layer;
    providing a second electrical contact that is electrically coupled with the substrate;
    wherein the substrate, first layer, first electrical contact, and second electrical contact collectively define at least a portion of an electronic device.

11. The method of claim 10 wherein the electronic device is selected from the group consisting of a Schottky diode, a substantially solar-blind photodetector, and a sensor.

12. The method of claim 1 wherein the first layer is formed such that it includes a first dopant, and wherein the first layer has a doping concentration that is within the range of $1\times10^{15}$ cm$^{-3}$ to $9\times10^{19}$ cm$^{-3}$.

13. The method of claim 1 wherein the first layer is formed such that the first material is selected from the group consisting of lithium gallium oxide, indium oxide, aluminum gallium oxide, and indium gallium oxide.

14. The method of claim 1 wherein the first vapor is provided to the reaction chamber via a carrier gas flowing through a conduit that is fluidically coupled with the reaction chamber, the carrier gas being an inert gas.

15. The method of claim 14 wherein the first precursor is provided to the reaction chamber via the conduit.

16. A method comprising: forming a first layer on a substrate, wherein the first layer includes a first material that is substantially crystalline and is an ultrawide bandgap oxide semiconductor, and wherein the first layer is formed by operations comprising:
    conveying a first vapor of the first material to a reaction chamber via a conduit that is fluidically coupled with the reaction chamber;
    providing a first precursor comprising a second material to the reaction chamber;
    reacting the first vapor and the first precursor in the reaction chamber at a growth temperature; and
    controlling a pressure in the reaction chamber such that the pressure is less than or equal to 50 Torr.

17. The method of claim 16 further comprising controlling the growth temperature within the range from approximately 750° C. to approximately 1000° C.

18. The method of claim 16 further comprising:
    forming a first electrical contact that is electrically coupled with the first layer; and
    providing a second electrical contact that is electrically coupled with the substrate;
    wherein the substrate, first layer, first electrical contact, and second electrical contact collectively define at least a portion of an electronic device.

19. The method of claim 18 wherein the electronic device is selected from the group consisting of a Schottky diode, a substantially solar-blind photodetector, and a sensor.

20. The method of claim 16 wherein the first layer is formed such that the first material is selected from the group consisting of lithium gallium oxide, indium oxide, aluminum gallium oxide, and indium gallium oxide.

* * * * *